(12) United States Patent
Iben et al.

(10) Patent No.: US 7,723,200 B2
(45) Date of Patent: May 25, 2010

(54) ELECTRICALLY TUNABLE RESISTOR AND RELATED METHODS

(75) Inventors: Icko E. Iben, Santa Clara, CA (US); Alvin W. Strong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 11/691,755

(22) Filed: Mar. 27, 2007

(65) Prior Publication Data

US 2008/0237797 A1 Oct. 2, 2008

(51) Int. Cl.
*H01L 27/01* (2006.01)
*H01L 29/00* (2006.01)

(52) U.S. Cl. .................. 438/385; 438/469; 257/48; 257/536

(58) Field of Classification Search .................. 257/E29.325–E29.346, 380, 385, 538, 904, 257/154, 350, 358–359, 363, 379, 381, 516, 257/533, 543, 571–572, 577, 580–582, E21.004–E21.007, 257/48, 508, 536–537, E27.009, E27.114, 257/E27.116; 438/10–11, 13–14, 17–18, 438/125, 381–382, 384–385, 466, 469, 761–762; 219/209, 494, 501; 338/7–10, 23–25
See application file for complete search history.

(56) References Cited

U.S. PATENT DOCUMENTS

| | | | | |
|---|---|---|---|---|
| 4,560,583 A * | 12/1985 | Moksvold | ............... | 438/11 |
| 4,954,383 A | 9/1990 | King et al. | | |
| 5,474,948 A * | 12/1995 | Yamazaki | ............... | 438/238 |
| 5,817,368 A | 10/1998 | Hashimoto | | |
| 6,055,179 A * | 4/2000 | Koganei et al. | ............ | 365/158 |
| 6,104,277 A * | 8/2000 | Iniewski et al. | ............. | 338/311 |
| 6,140,906 A * | 10/2000 | Kaihara et al. | ............ | 338/22 R |
| 6,255,185 B1 * | 7/2001 | Coolbaugh et al. | .......... | 438/382 |
| 6,359,339 B1 * | 3/2002 | Gregor et al. | ............... | 257/757 |
| 6,395,575 B1 * | 5/2002 | Umeda et al. | ................ | 438/54 |
| 6,504,220 B2 * | 1/2003 | Sato | ........................... | 257/380 |
| 6,825,490 B1 * | 11/2004 | Hook et al. | ................... | 257/48 |
| 6,958,523 B2 * | 10/2005 | Babcock et al. | ............. | 257/538 |
| 6,960,744 B2 * | 11/2005 | Adkisson et al. | ............ | 219/494 |
| 7,052,925 B2 * | 5/2006 | Murphy et al. | ................ | 438/48 |
| 7,536,577 B2 * | 5/2009 | Desai et al. | .................. | 713/340 |
| 2005/0030149 A1 * | 2/2005 | Adkisson et al. | ............. | 338/23 |

(Continued)

FOREIGN PATENT DOCUMENTS

JP 2003226020 A 8/2003

(Continued)

*Primary Examiner*—W. David Coleman
*Assistant Examiner*—Maliheh Malek
(74) *Attorney, Agent, or Firm*—Anthony J. Canale; Hoffman Warnick LLC

(57) ABSTRACT

An electrically tunable resistor and related methods are disclosed. In one embodiment, the resistor includes a first resistive layer, at least one second resistive layer, and an intermediate interdiffused layer of the first resistive layer and the at least one second resistive layer. One method may include providing a first plurality of layers of different materials surrounded by at least one insulating layer, and passing a current pulse through the first plurality of layers to affect a conductivity structure of the first plurality of layers in order to obtain a first predetermined resistance value for the resistor.

14 Claims, 2 Drawing Sheets

U.S. PATENT DOCUMENTS

2005/0227449 A1* 10/2005 Murphy et al. ............... 438/384
2005/0230785 A1* 10/2005 Coolbaugh et al. ........... 257/536
2006/0145296 A1* 7/2006 Coolbaugh et al. ........... 257/536
2007/0176260 A1* 8/2007 Parekh ........................ 257/536
2008/0061332 A1* 3/2008 Saito et al. ................... 257/295
2008/0191728 A1* 8/2008 Attalla et al. ................ 324/765
2008/0231306 A1* 9/2008 Maggi et al. ................. 324/763
2008/0272460 A1* 11/2008 Beach et al. ................. 257/536
2009/0011526 A1* 1/2009 Ballantine et al. ............ 438/17
2009/0219129 A1* 9/2009 Denier et al. ................. 338/25

FOREIGN PATENT DOCUMENTS

SU            1020869 A    5/1983

* cited by examiner

ELECTRICALLY TUNABLE RESISTOR AND RELATED METHODS

BACKGROUND OF THE DISCLOSURE

1. Technical Field

The disclosure relates generally to integrated circuit (IC) chips, and more particularly, to an electrically tunable resistor and related methods.

2. Background Art

Thin film resistors are used in the integrated circuit (IC) chip industry. The resistance R of a rectangular sheet of material of width W, height H and thickness d is determined by the film resistivity (rho) by: R=rho*W/(H*d). Any of the above mentioned parameters can be varied to vary the resistance R.

A number of challenges exist relative to controlling the resistance. First, if different resistance values in a circuit are desired, the geometric parameters width W, height H or thickness d, and/or the material resistivity rho, must be varied. Second, tolerance variations in material resistivity rho, width W, height H and thickness d will lead to variations in resistance. Third, new variations in the resistance values derived by changing the resistor geometry require new masks to make specialty IC chips. Finally, changes in the resistance from a variation in material resistivity rho require a change of the deposition material, which is costly and limited by available deposition materials.

One approach to adjust a resistance value includes trimming resistors to change their physical dimensions. SU 1020869 is an example of this approach in which a heating pulse current is applied to the resistor prior to laser trimming.

SUMMARY OF THE DISCLOSURE

An electrically tunable resistor and related methods are disclosed. In one embodiment, the resistor includes a first resistive layer, at least one second resistive layer, and an intermediate interdiffused layer of the first resistive layer and the at least one second resistive layer. One method may include providing a first plurality of layers of different materials surrounded by at least one insulating layer, and passing a current pulse through the first plurality of layers to affect a conductivity structure of the first plurality of layers in order to obtain a first predetermined resistance value for the resistor.

A first aspect of the disclosure provides a method of forming a resistor, the method comprising: providing a first plurality of layers of different materials surrounded by at least one insulating layer; and passing a current pulse through the first plurality of layers to affect a conductivity structure of the first plurality of layers in order to obtain a first predetermined resistance value for the resistor.

A second aspect of the disclosure provides a resistor comprising: a first resistive layer; at least one second resistive layer; and an intermediate interdiffused layer of the first resistive layer and the at least one second resistive layer.

A third aspect of the disclosure provides a method of forming a resistor, the method comprising: providing a first plurality of layers of different materials; first passing a current pulse through the first plurality of layers to affect a conductivity structure of the first plurality of layers in order to obtain a first predetermined resistance value for the resistor; measuring a resistance of the first plurality of layers; determining a calibration for tuning the resistance based on the measuring; providing at least one second plurality of layers of different materials substantially identical to the first plurality of layers; and second passing a current pulse through each of the at least one second plurality of layers to affect a conductivity structure of each second plurality of layers in order to obtain a second predetermined resistance value different from the first predetermined resistance value.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
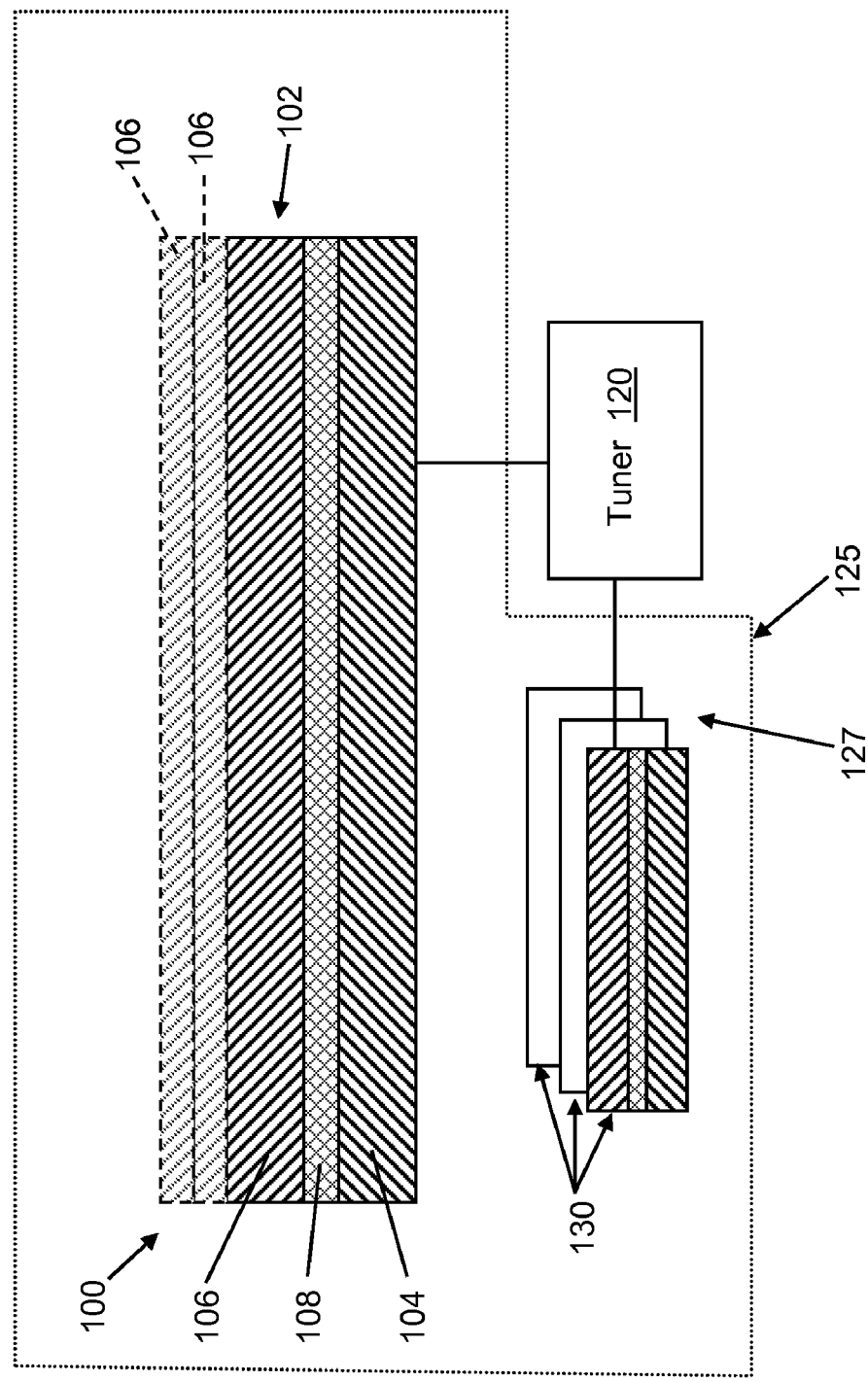
FIG. 1 shows one embodiment of an electrically tunable resistor.

Referring to FIG. 1, one embodiment includes a method of forming a resistor 100. First, a plurality of layers 102 of different materials is provided. As shown, plurality of layers 102 includes a first resistive layer 104 and at least one second resistive layer 106. Any number of second resistive layer(s) 106 may be employed. Resistive layers 104, 106 may include any now known or later developed resistive material. However, in one embodiment, resistive layers 104, 106 each include a conductive material such as a metal. Where metals are used, resistive layers 104, 106 of, for example, iron (Fe) and cobalt (Co), respectively, may be employed. First resistive layer 104 may include a first metal material and at least one second resistive layer 106 may include at least one other different metal material. Other materials may also be employed including but not limited to chromium (Cr), copper (Cu), silver (Au), gold (Ag), aluminum (Al), ruthenium (Ru), platinum (PI), tantalum (Ta), molybdenum (Mb), tungsten (W) and nickel (Ni). Alloys of the metals could also be used, such as 80 permalloy (80:20 Ni:Fe). It is best to choose metals which will mix and interdiffuse with one another during tuning to form a (new) interdiffused layer 108 as well as having different enough resistivities so that the resistance of the fully mixed metals is different enough from the resistance of the two initial parallel sheets of the metals. The metals chosen should undergo interdiffusion prior to electromigration for the range of possible pulse durations and power levels which could be reasonably used to tune the system resistance. Note the positioning of each layer is only illustrative. Also, note that interdiffused layer 108 could expand to include the physical extant of layers 104 and 106 after the tuning process is complete.

Resistive layers 104 and 106 are positioned between insulating layers 110 and 116. That is, insulating layers 110, 116 are adjacent to resistive layers 104, 106, respectively. In one embodiment, insulating layer 110, 116 are diffusion barrier layers to ensure interdiffusion of resistive layers 104, 106 during the tuning pulsing. In another embodiment, insulating layers 110, 116 do not prevent diffusion, i.e., they are chosen so that diffusion into those layers is preferential during the tuning pulsing. Note, they could also be chosen to be opposite in terms of their diffusivity. Insulating layers 110, 116 serve to electrically isolate resistive layers 104, 106, and in one embodiment, to serve as a diffusion barrier to contain the total thickness of resistive layers 104, 106. Examples of insulating layers 110, 116 include alumina, silica and low dielectric constant materials. For electrical isolation, the materials for insulating layers 110, 116 are chosen to have a high electrical resistivity relative to resistive layers 104, 106. For a diffusion barrier, insulator layers 110, 116 are chosen such that resistive layers 104, 106 have a low solubility in them, such that insulator layers 110, 116 are stable at the temperatures and pulse durations used to tune resistor 100.

Next, in order to electrically tune resistor 100, a tuner 120 passes a current pulse through plurality of layers 102 to affect a conductivity structure of plurality of layers 102 in order to obtain a first predetermined resistance value R1 for resistor 100. That is, tuner 120 can alter the resistance of plurality of layers 102 (i.e., resistor 100) by passing current pulse(s) through layers 102 to heat the stack to a desired temperature for a desired pulse duration using an appropriate current level. The desired change in resistance dictates the power level, duration and number of the current pulse(s).

As shown in FIG. 1, the conductivity structure change may result in an interdiffused layer 108 of first resistive layer 104 and the at least one second resistive layer 106. For example, where iron (Fe) and cobalt (Co) are used in resistive layers 104, 106, an iron-cobalt alloy interdiffused layer 108 results. The materials in plurality of layers 102 are chosen such that with the proper amount and duration of current pulse (power applied), interdiffusion occurs in layers 102, resulting in a stable alloy rather than electromigration. In any event, the final resistance values ranges from the parallel resistance of the separate layers 104, 106, 108 to the resistance for a complete alloy. Again, note that depending on the materials chosen and the power applied, layers 104 and 106 may have been more or less enveloped by layer 108.

Tuner 120 may further be employed to pass a plurality of current pulses through plurality of layers 102, and measure a resistance change ΔR in plurality of layers 102 after each pulse or group of pulses. Each current pulse may have a different voltage and/or duration. In any event, based on the measurements, a calibration for tuning the resistance can be determined, e.g., for each type of plurality of layers and/or for each layer. For example, layers 102 can be subjected to increasing current level pulses of controlled levels. The resistance change after each current pulse can be measured and based on the change in resistance. The next current pulse can either be of a slightly higher voltage or at the same voltage. Current pulse(s) are applied to layers 102 until the desired resistance is achieved.

A temperature versus power of the combined initial resistance of resistor 100 can be determined by the following means. First, the resistance versus temperature of the initial resistor 100 can be measured in an oven. Second, the temperature rise (ΔT) versus power ($P_{in}$) at a fixed pulse duration (τ) is given by the thermal conductance $\kappa_r$, ($\kappa_r(\tau)=P_{in}/\Delta T(\tau)$) and can be determined for fixed pulse durations by measuring the voltage across, and the current into, resistor 100 at low power levels where the sensor is not damaged. The power is given by the current times the voltage, and the resistance is given by the voltage divided by the current. The temperature rise is then determined by the measured resistance change, which is here assumed to increase linearly with temperature. The temperature of resistor 100 is then determined by assuming a linear relationship between resistor 100 resistance and the temperature rise: $R_r(\Delta T(\tau))=R_r(0)*(1+\alpha\Delta T(\tau))$, where $R_r$ is the resistance, ΔT is temperature rise, τ is duration and α is a thermal coefficient of resistance. The thermal coefficient of resistance (α) is measured in an oven. When applying a high-current pulse, the temperature rise is then determined by: $\Delta T(\tau)=(P_{in}/\kappa_r(\tau))$, where ΔT is temperature rise, τ is duration, $P_{in}$ is power, and $\kappa_r$ is the thermal conductance. These equations can be used to accurately predict the current/voltage requirements for tuning resistor 100. Based on this, the temperature of resistor 100 versus power can also be determined from low voltage pulses.

Based on this information, any number of other substantially identical (e.g., substantially similar dimensions and/or materials) plurality of layers 130 can also be tuned. In this setting, plurality of layers 102 may act as a test section 127 within an integrated circuit (IC) chip 125. That is, one set of layers 102 may act as sacrificial parts to quantify the behavior of layers 102 so the appropriate current pulses for a given resistance change can be pre-determined. As a result, at least one second plurality of layers 130 substantially identical to plurality of layers 102 may be provided in IC chip 125 to provide resistor(s) 100. Tuner 120 can then be used to pass a current pulse through each of the at least one second plurality of layers 130 to affect a conductivity structure of each second plurality of layers 130 in order to obtain a second predetermined resistance value different from the first predetermined resistance value for plurality of layers 102.

The above-described process may occur during manufacture or in-the-field after manufacture. For example, tuner 120 may be employed to alter the resistance of any resistor 100 by passing a current pulse having a known voltage through resistor 100 to affect a known change in the resistance of resistor 100. In-situ resistance tuning enables the manufacturer to loosen the tolerances during deposition of plurality of layers 102, 130. It also allows the manufacturer to use a single deposition process with subsequent tuning of specific resistors to the desired values. Neighboring resistors made with the same materials can be tuned to different values. Based on this structure, resistor networks may be employed in which series and/or parallel combinations are used to achieve, first, a gross value of resistance and then electrically tuned to the final value. Note, a multiplexer (not shown) may be necessary to reconfigure the resistor network before invoking the electrical fine tuning. Furthermore, tuning during the life of the IC chip is now possible, further enabling autonomic or self-correcting computing.

A resistor 100 according to one embodiment may include first resistive layer 104, at least one second resistive layer 106 surrounded by at least one insulating layer 110, 116, and intermediate interdiffused layer 108 of first resistive layer 104 and at least one second resistive layer 106. Further, resistor 100 may include tuner 120 for passing a current pulse through plurality of layers 102 to affect a conductivity structure of resistive layer 104 and second resistive layer(s) 106 in order to obtain a first predetermined resistance value for resistor 100. As indicated above, tuner 120 may be operable after manufacture of resistor 100.

Figure 2:
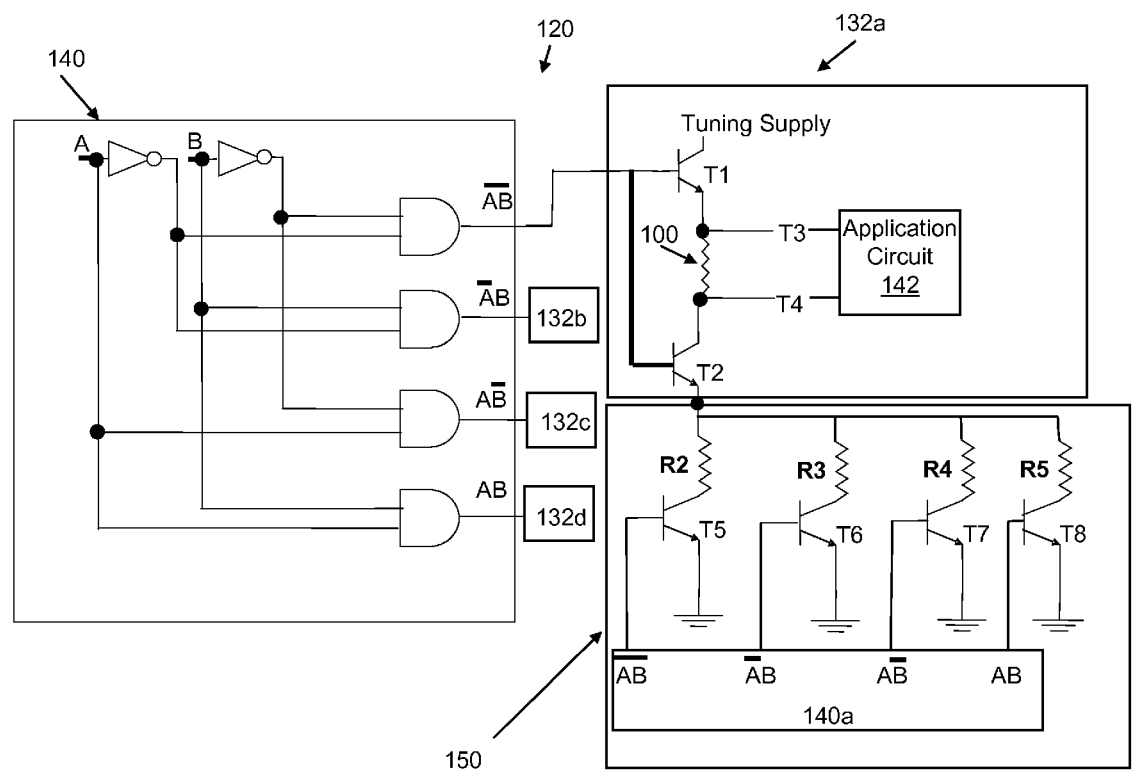
FIG. 2 shows one illustrative tuner for the electrically tunable resistor of FIG. 1.

Referring to FIG. 2, one illustrative tuner 120 is shown. The simplest embodiment of tuner 120 is just a single tuner and application circuit 132a. In all cases, the tuning supply could be either internal or external to the chip.

Another embodiment would include tuning and application circuits 132a-132d and a decode circuitry 140. This example is for on-chip tuning and uses decode circuitry 140 to allow each resistor 100 to be individually tuned. Although simple logic gates are shown and would correctly function as shown, other schemes, could be used that would potentially save space or write time. Transistor T2 is a decoding activation/isolation transistor, and transistors T3 and T4 are activation/isolation transistors from an application circuit 142. One implementation would be for a single set of decoders to be used to select resistor 100 being tuned and to provide the appropriate tuning voltage level and pulses externally.

Another implementation would be to use additional decoder circuitry 140, once a given resistor 100 has been selected, to build the appropriate signal internally. In this case, shown as a fine current tuning circuit 150, one or more transistors T6-T8, would be placed in parallel with a decode transistor T5, and used with a fine current tuning decoder 140a to apply the required signal level. Each transistor could have differing load resistors R2-R5, to apply the appropriate pulse controlled by the second decode network, i.e., fine current tuning decoder 140a.

Each general application circuit 142 type would need to be considered for the best tuning circuit, although most would likely be very similar. Application circuit 142 is shown on the other side of activation/isolation transistors T3 and T4 when those transistors are used, but would be directly connected to resistor 100 when they are not used. Activation/isolation transistors T3 and T4 are optional isolation transistors and are off during the tuning current pulse. Activation/isolation transistors T3 and T4 might not be necessary if application circuit 142 has an input impedance that is sufficiently large so that application circuit 142 is not damaged by the tuning voltage pulse. Activation/isolation transistor T2 and decode transistor T5 between resistor R2 and ground is also potentially optional depending on application circuit 142.

One illustrative operation of tuner 120 would be as follows: First, activation/isolation transistors T3 and T4 would be turned off to isolate resistor 100 from the application circuit 142. Second, fine current tuning circuitry 150 would be activated, uniquely turning on decode transistor T5. Finally, decode circuitry 140 would turn on activation/isolation transistors T1 and T2 the appropriate length of time to provide the tuning current pulse. Also note that activation/isolation transistor T2 could be operated independently of activation/isolation transistor T1. One case would be for activation/isolation transistor T1 to be turned on and then use activation/isolation transistor T2 to control the pulse duration.

The above-described circuit and the detailed operations are only meant as an example of an implementation where most of the control is at the chip level. Depending on the circuit and conditions, several turn on and turn off schemes could be envisioned even for this simple circuit.

In principle this device could be used at the end of manufacturing process of a first metal layer (M1), at final wafer test, at module final test, or in the field with a system designed for autonomic computing. Note that in the first two cases, the tuning of each resistor 100 might be best accomplished by addressing each resistor with an external tuning supply by means of wafer probing. For the latter two cases, some on-chip decoding would likely be necessary.

Real-time tunable resistor 100 also allows design of a system capable of detecting when a given critical parameter is reaching its failure point. In this case, tuner 120 may implement the above-described method to take corrective action such that: 1) the IC chip or a portion thereof is taken out of service, 2) the tuning activation/isolation transistors are activated, 3) the appropriate decode circuitry 140 and/or fine current tuning circuitry 150 is activated, and 4) resistor 100 is then tuned to extend the operating life of that critical component. Although for some technology mechanisms, other means are available to extend the life due to reliability, an electrically tunable resistor 100 provides the ability and opportunity to change the operating point of transistors even for those mechanisms which cannot be directly healed and hence provide relief during the operation in the field.

Although one illustrative tuner 120 has been shown, it is understood that a large variety of other tuners may be employed and are considered within the scope of the disclosure.

The structures and methods as described above are used in the fabrication of integrated circuit chips. For example, resistor 100 may be used in a tape head, magnetic random access memory (MRAM), etc. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method of forming a resistor, the method comprising:
providing a first plurality of layers of different materials between two insulating layers;
passing a current pulse through the first plurality of layers for a first predetermined pulse duration to attain a first predetermined temperature to affect a conductivity structure of the first plurality of layers in order to obtain a first predetermined resistance value for the resistor;
providing at least one second plurality of layers of different materials substantially identical to the first plurality of layers;
passing a current pulse through each of the at least one second plurality of layers for a second predetermined pulse duration to attain a second predetermined temperature to affect a conductivity structure of each second plurality of layers in order to obtain a second predetermined resistance value different from the first predetermined resistance value; and
repeating the passing of the current pulses through both of the first plurality of layers and the at least one second plurality of layers until each has attained a desired resistance value.

2. The method of claim 1, wherein the first plurality of layers includes a cobalt (Co) alloy layer and a nickel: iron (Ni:Fe) alloy layer.

3. The method of claim 1, wherein each of the first plurality of layers includes a conductive material.

4. The method of claim 1, further comprising measuring a resistance change in the first plurality of layers after each pass of the current pulse.

5. The method of claim 4, wherein each current pulse has at least one of a different voltage and a different duration.

6. The method of claim 4, further comprising determining a calibration for tuning the resistance of the first plurality of layers based on the measuring of the resistance change in the first plurality of layers after each pass of the current pulse.

7. The method of claim 1, wherein the first plurality of layers includes a test section within an integrated circuit (IC) chip.

8. The method of claim 1, further comprising measuring a resistance change in of the at least one second plurality of layers after each pass of the current pulse.

9. The method of claim 8, further comprising determining a calibration for tuning the resistance of the at least one second plurality of layers based on the measuring of the resistance change in the at least one second plurality of layers after each pass of the current pulse.

10. The method of claim 1, wherein the insulating layers are diffusion barrier layers.

11. A method of forming a resistor, the method comprising:
providing a first plurality of layers of different materials;
first, passing a current pulse through the first plurality of layers to affect a conductivity structure of the first plurality of layers in order to obtain a first predetermined resistance value for the resistor;
measuring a resistance of the first plurality of layers after passing the current pulse therethrough;
repeating the passing of the current pulse through the first plurality of layers and measuring of the resistance of the first plurality of layers after passing a current pulse;
determining a calibration for tuning the resistance of the first plurality of layers based on the measuring of the resistance change in the first plurality of layers after each pass of the current pulse;
providing at least one second plurality of layers of different materials substantially identical to the first plurality of layers;
second, passing a current pulse through each of the at least one second plurality of layers to affect a conductivity structure of each second plurality of layers in order to obtain a second predetermined resistance value different from the first predetermined resistance value;
measuring a resistance of the at least one second plurality of layers after passing the current pulse therethrough;
repeating the passing of the current pulse through the at least one second plurality of layers and measuring of the resistance of the at least one second plurality of layers after passing a current pulse;
determining a calibration for tuning the resistance of the at least one second plurality of layers based on the measuring of the resistance change in the at least one second plurality of layers after each pass of the current pulse; and
repeating the passing of the current pulse through the first and the at least one second plurality of layers that is in accordance with each respective calibration, measuring and determining a calibration after each passing of a current pulse until a desired resistance value has been attained for the first plurality of layers and the at least one second plurality of layers.

12. The method of claim 11, wherein each plurality of layers includes a metal.

13. The method of claim 11, wherein each current pulse has at least one of a different voltage and a different duration.

14. The method of claim 11, wherein the first plurality of layers includes a test section within an integrated circuit (IC) chip.

* * * * *